United States Patent
Kubik

(10) Patent No.: US 9,310,446 B2
(45) Date of Patent: Apr. 12, 2016

(54) MAGNETIC FIELD DIRECTION DETECTOR

(71) Applicant: ANALOG DEVICES, INC., Norwood, MA (US)

(72) Inventor: Jan Kubik, Raheen (IE)

(73) Assignee: ANALOG DEVICES, INC., Norwood, MA (US)

( * ) Notice: Subject to any disclaimer, the term of this patent is extended or adjusted under 35 U.S.C. 154(b) by 645 days.

(21) Appl. No.: 13/655,059

(22) Filed: Oct. 18, 2012

(65) Prior Publication Data
US 2014/0111192 A1 Apr. 24, 2014

(51) Int. Cl.
G01B 7/14 (2006.01)
G01R 33/00 (2006.01)
G01R 33/09 (2006.01)

(52) U.S. Cl.
CPC ........ *G01R 33/0017* (2013.01); *G01R 33/0035* (2013.01); *G01R 33/09* (2013.01)

(58) Field of Classification Search
CPC ....... H01L 43/06; H01L 43/08; H01L 27/105; G01R 33/0035; G01R 33/07; G01R 33/09; G01R 33/096; G01R 33/0017; G01R 33/02; G01R 15/20576; G01V 3/26; G01V 3/08; G01V 3/10
USPC ........... 324/207.11, 207.13, 207.21, 244–263
See application file for complete search history.

(56) References Cited

U.S. PATENT DOCUMENTS

| | | | | |
|---|---|---|---|---|
| 5,243,403 A * | 9/1993 | Koo | ................... | G01R 33/0327 250/227.19 |
| 6,335,081 B1 * | 1/2002 | Araki | ................... | B82Y 10/00 324/252 |
| 6,373,247 B1 * | 4/2002 | Marx | ................... | B82Y 25/00 324/207.21 |
| 7,656,630 B2 * | 2/2010 | Bonvalot | ............. | G06K 19/073 361/231 |
| 7,969,149 B2 * | 6/2011 | Shoji | ................... | G01R 33/093 324/252 |
| 8,058,864 B2 * | 11/2011 | Scheller | ............ | G01R 33/0029 324/200 |
| 8,125,221 B2 * | 2/2012 | Muthers | ............. | G01R 33/0029 324/246 |
| 8,593,134 B2 * | 11/2013 | Haratani | ................ | B82Y 25/00 324/117 R |
| 9,170,281 B2 * | 10/2015 | Hayashi | ................ | B82Y 25/00 |
| 2003/0151406 A1 * | 8/2003 | Wan | ..................... | G01R 33/096 324/252 |
| 2008/0088996 A1 * | 4/2008 | Bonvalot | ............. | G06K 19/073 361/78 |
| 2008/0186635 A1 * | 8/2008 | Takenaga | ................ | B82Y 25/00 360/313 |
| 2009/0051353 A1 * | 2/2009 | Takeya | .................... | B82Y 25/00 324/207.21 |
| 2010/0264909 A1 * | 10/2010 | Scheller | ............ | G01R 33/0029 324/207.2 |

(Continued)

FOREIGN PATENT DOCUMENTS

EP 1467218 A2 * 10/2004 ............. F24C 13/08
WO WO 2009058290 A1 * 5/2009 ............. G01D 5/145

OTHER PUBLICATIONS

Patterson, Mark. Hall Effect and Magnetoresistance, University of Dayton, Feb. 27, 2007.*

(Continued)

*Primary Examiner* — Arleen M Vazquez
*Assistant Examiner* — Sean Curtis
(74) *Attorney, Agent, or Firm* — Knobbe Martens Olson and Bear, LLP

(57) ABSTRACT

A magnetic field direction detector for detecting whether a magnetic flux has a component of field from a first side or a second side of a detection axis; the magnetic field direction detector comprising: a first magneto-resistive sensor; and a perturbation generator; wherein the perturbation generator causes an external magnetic field to be perturbed so as to cause the apparent direction of flux to change by an angle $\theta_1$ at the first magneto-resistive sensor.

20 Claims, 17 Drawing Sheets

(56) References Cited

U.S. PATENT DOCUMENTS

| | | | | |
|---|---|---|---|---|
| 2010/0321010 | A1* | 12/2010 | van Veldhoven | B82Y 25/00 324/225 |
| 2011/0018533 | A1* | 1/2011 | Cesaretti | G01R 33/0035 324/251 |
| 2011/0031960 | A1* | 2/2011 | Hohe | G01R 33/0017 324/202 |
| 2012/0165656 | A1* | 6/2012 | Montag | A61B 5/062 600/424 |
| 2013/0320972 | A1* | 12/2013 | Loreit | B82Y 25/00 324/252 |

OTHER PUBLICATIONS

Caruso et al., "A New Persepective on Magnetic Field Sensing," May 1998, Honeywell, Inc.*

Macintyre, Steven A., "Macintyre Electronic Design: Magnetic Field Measurement," Copyright 1999 by CRC Press, LLC.*

Magnetic Field Sensor KMR 360, HLPLANAR Technik, *HL-Planartechnik GmbH* 4 pages, accessed at: http://www.meas-spec.cn/manage/sensortypes/KMR360eng.pdf, May 12, 2003.

AS5030 Datasheet, 44 pages, © 1997-2013; ams AG; printed on Jul. 29, 2013 from: http://www.ams.com/eng/content/download/11929/212604/file/AS5030_Datasheet_v2-4.pdf.

KMZ43T Magnetic Field Sensor Product data sheet, NXP B.V., Mar. 4, 2009, 8 pages, downloaded from: http://www.nxp.com/documents/data_sheet/KMZ43T.pdf.

KMA221 Programmable angle sensor product data sheet, Jul. 16, 2013, NXP B.V., downloaded from: http://www.nxp.com/documents/data_sheet/KMA221.pdf.

AN211 Application Note: Applications of Magnetic Position Sensors, Honeywell Sensor Products, 8 pages, 01-02 Rev. Printed on Jul. 29, 2013. Downloaded from: http://www51.honeywell.com/aero/common/documents/Applications-of-Magnetic-Position-Sensors.pdf.

Magnetic Displacement Sensors, HMC1501/1512, Honeywell, 8 pages, Dec. 2010, downloaded from: http://www51.honeywell.com/aero/common/documents/myaerospacecatalog-documents/Missiles-Munitions/HMC1501-1512.pdf.

Axel Bartos, Principle of a 360° Measurement Utilizing HL Planar's Sensor KMR360, HLPLANAR Technik, Jan. 18, 2005, 10 pages. Originally available from: http://www.hlplanar.de.

European Search Report of Feb. 25, 2014 for European Patent Application No. 13188291.2, 13 pages.

* cited by examiner

MAGNETIC FIELD DIRECTION DETECTOR

FIELD OF THE INVENTION

The present invention relates to a magnetic field direction detector operable to tell whether a magnetic flux comes from one side or another side of a sensing direction. Two such detectors may be used in conjunction to determine a quadrant of a circle from which a magnetic flux comes. In general one or more such detectors may be used to determine a two or three dimensional sector from which a magnetic flux originates.

BACKGROUND

Magnetic field direction detectors, of the type described herein, can be used to resolve the direction of a magnetic field into one of a couple or several sectors. This can be very useful to resolve ambiguity from angular position sensors using magnets to track the rotary motion of an object.

SUMMARY OF THE INVENTION

According to the present invention there is provided a magnetic field direction detector for detecting whether a magnetic flux has a component of field from a first side or a second side of a detection axis; the magnetic field direction detector comprising:
 a first magneto-resistive sensor; and
 a perturbation generator;
 wherein the perturbation generator causes an external magnetic field to be perturbed so as to cause the apparent direction of flux to change by an angle $\theta_1$ at the first magneto-resistive sensor.

In an embodiment a magnetic field direction detector is provided for detecting whether a magnetic flux has a component of field from a first side or a second side of a detection axis; the magnetic field direction detector comprising:
 a first magneto-resistive sensor;
 a second magneto-resistive sensor; and
 a perturbation generator;
 wherein the perturbation generator causes an external magnetic field to be perturbed so as to cause the apparent direction of flux to change by an angle $\theta_1$ at the first magneto-resistive sensor, and the apparent direction of flux to change by an angle $\theta_2$ at the second magneto-resistive sensor, such that the relative resistances of the first and second magneto-resistive sensors vary with respect to one another.

It is thus possible to provide a robust solid state sensor that can identify what sector, in this instance a semi-circle (or hemisphere in a three dimensional environment) a line of magnetic flux travels from.

Furthermore, a plurality of sensors may be used in co-operation for localizing the direction of the magnetic field into more tightly defined sectors. In an embodiment of the invention two magnetic field direction detectors are provided in a crossed configuration to allow the direction of a magnetic field to be resolved into a quadrant.

According to a second aspect of the present invention there is provided a method of resolving directional uncertainty about the direction of a magnetic field, the method comprising producing a perturbing magnetic field at a magnetic sensor such that, for first direction of magnetic field the resultant combination makes a first observable change of a parameter of the magnetic field sensor, and for a second direction of magnetic field opposed to the first direction the resultant combination makes a second observable change in a parameter of the magnetic field sensor.

BRIEF DESCRIPTION OF THE DRAWINGS

Embodiments of the present invention will be described, by way of non-limiting example only, with reference to the accompanying drawings, in which.

DETAILED DESCRIPTION OF THE PREFERRED EMBODIMENT

Figure 1:
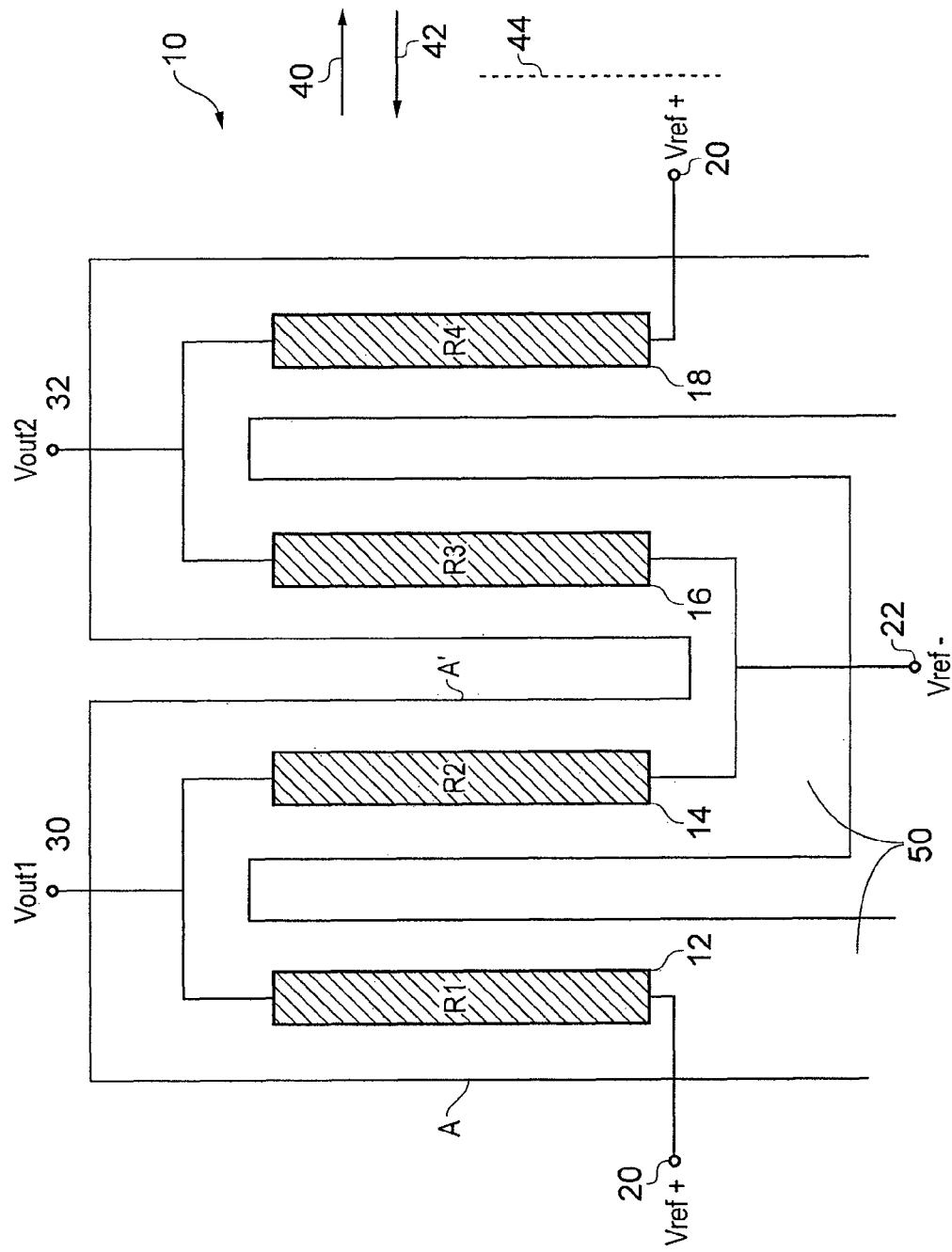
FIG. 1 is a schematic view of an embodiment of a magnetic field direction detector.

FIG. 1 is a plan view of a first embodiment of a magnetic field direction detector. The magnetic field direction detector 10 comprises first to fourth magneto-resistors 12, 14, 16 and 18 having respective resistances R1 to R4. The first and second magneto-resistors 12 and 14 are connected in series between a first reference node 20 and a second reference node 22. For convenience the first reference node 20 may, in use, be connected to receive a first reference voltage Vref+ and the second reference node may receive a second reference Vref−. These voltages may, advantageously, be provided by stabilized voltage references. Under circumstances where the reference voltages Vref+ and Vref− are well controlled, then a direction detector need only have one of the first and second magneto-resistors 12 and 14. However, for greater immunity to voltage variation, to detector temperature drift and for enhanced sensitivity it is advantageous to provide the third and fourth resistors 16 and 18, so as to form a bridge configuration as shown in FIG. 2.

Figure 2:
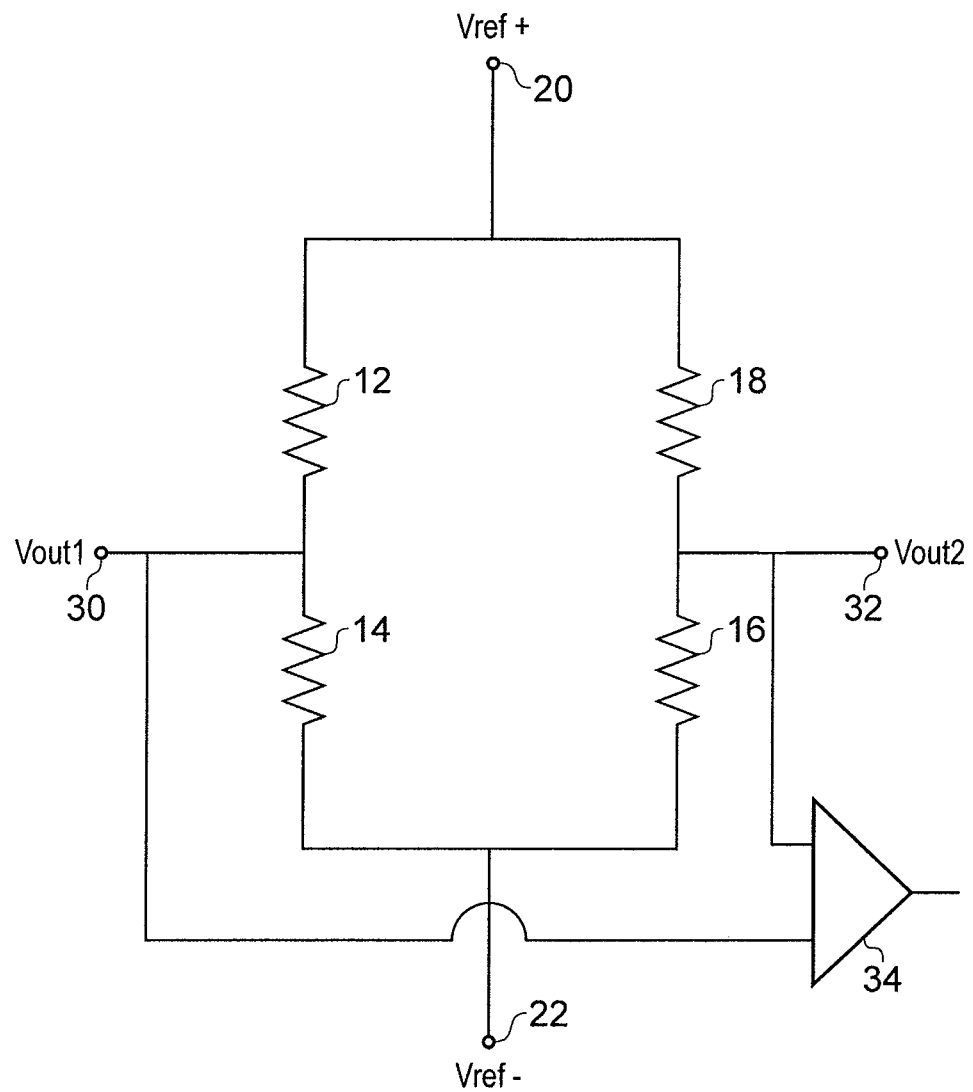
FIG. 2 is an equivalent circuit of the detector illustrated in FIG. 1.

Referring to FIG. 2, the bridge is formed by connecting a first end of the first magneto-resistor 12 to the first reference node 20 and a second end to a first output node 30 and to a first end of the second magneto-resistor 14. A second end of the second magneto-resistor 14 is connected to the second voltage reference node 22.

Similarly a first end of the fourth resistor 18 is connected to the first reference node 20. A second end of the fourth resistor is connected to a second output node 32 and to a first end of the third magneto-resistor 16. A second end of the third magneto-resistor 16 is connected to the second reference node 22.

In use the output voltages at the first and second output nodes can be compared with each other to determine whether the magnetic field has a component that is in a first direction, designated by arrow 40 (FIG. 1), or a second direction 42 opposed to the first direction 40. Thus the sensor is responsive to the direction of a magnetic field with respect to a detection axis 44 and acts to determine if the magnetic field has a component of field from a first side or a second side of the detection axis. The comparison may be performed by a comparator 34.

The first to fourth magneto-resistors 12 to 18 are disposed in a first plane that is offset from a second plane which carries a perturbation generator for perturbing the magnetic field at the magneto-resistors. The perturbation generator may be a magnetized piece of material so as to generate a permanent field. However, in the context of integrated circuits it is often more convenient to use an electric current flowing in a conductor to generate the perturbation. This has the advantage that the magnitude and direction of the perturbation can be changed by drive circuitry. This is useful when determining the sensitivity of the magnetic field direction detector, or when performing steps to enhance signal processing, such as auto-zeroing actions to measure and/or compensate for offsets occurring in amplifiers or comparators connected to the output terminals 30 and 32.

Figure 3:
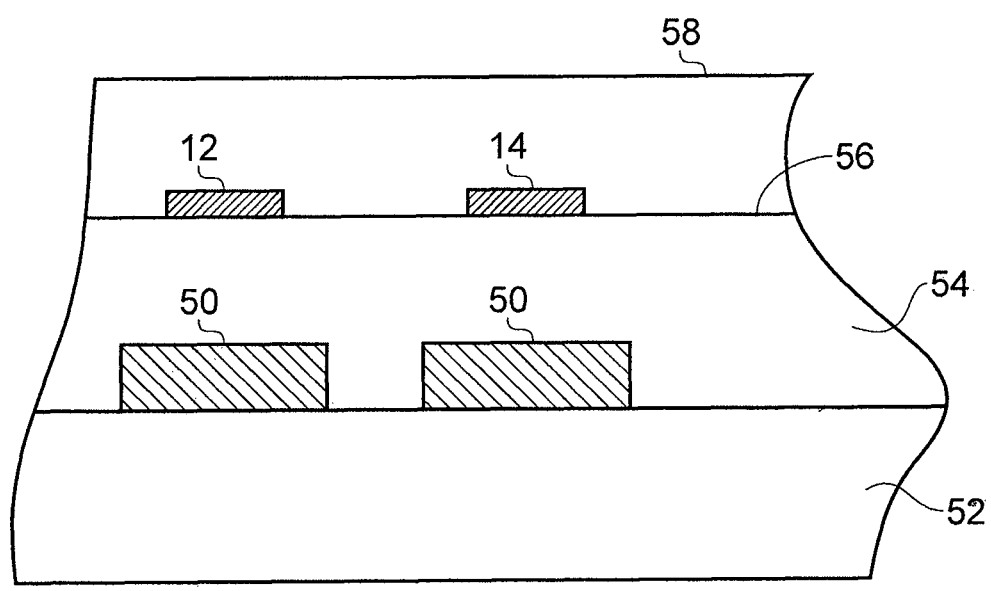
FIG. 3 is a cross section along the line A-A' of FIG. 1.

FIG. 3 is a cross section along the line A-A' of FIG. 1, and showing the first and second magneto-resistors 12 and 14, and the perturbation generator 50 formed by a conductive element. The conductive element is formed over a substrate, such as a silicon substrate 52 or a layer of an insulator, such as polyamide over a silicon substrate. The conductive element is itself surrounded by and embedded within an insulator 54, such as polyamide. The insulator 54 may, during manufacture of the magnetic field direction detector, be planarized so as to form a planar surface 56 over which the magneto-resistors 12 and 14 are deposited. The resistors are then enclosed in a protective layer 58 to protect them from environmental damage.

These steps are conventional to the person skilled in the art of device fabrication and need not be described here. It can be seen that with the magneto-resistors positioned as shown in FIG. 3, that they will be subjected to a magnetic flux due to current flowing in the conductor of the perturbation generator 50.

Returning to FIG. 1, it can be observed that the perturbation generator 50 has a folded path such that if the current flowing beneath the first magneto-resistor 12 has a first direction (say upwardly as shown in FIG. 1 and into the plane of the page of FIG. 3) then the current flowing beneath the second magneto-resistor 14 flows in an opposing direction (down the page of FIG. 1 and out of the plane of FIG. 3). Thus, when the perturbation generator 50 is carrying a current, different perturbing magnetic fields occur at the first magneto-resistor 12 and the second magneto-resistor 14.

Exactly the same effect also occurs at the third and fourth resistors 16 and 18.

Figure 4:
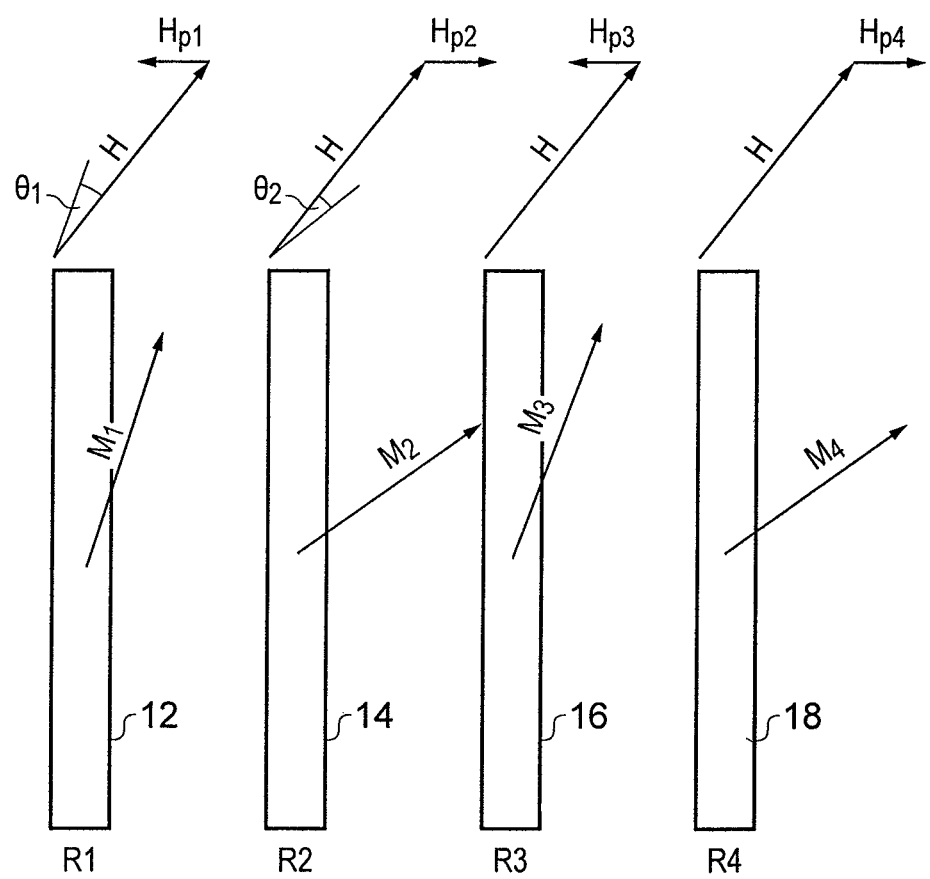
FIG. 4 is a vector diagram showing the vector addition of a perturbing magnetic field at each magneto-resistor to magnetic field whose direction is to be measured.

FIG. 4 schematically shows the vector addition of the perturbing magnetic field with an external magnetic field having a strength and direction illustrated by the vector "H". The perturbation at each magneto-resistor is represented by the vector $H_p$. In each instance the magnitude of $H_p$ has been shown as the same for each magneto-resistor but the direction for the first and third magneto-resistors is opposed to that for the second and fourth magneto-resistors.

The resultant vector sum is designated "M" for each resistor 12, 14, 16 and 18, and it can be seen that the direction of the resultant field $M_1$ for the first resistor 12 has changed by a first angle $\theta_1$ that differs from that of the resultant field $M_2$ for the second magneto-resistor 14 which has changed by a second angle $\theta_2$. Also, but not so clearly shown, the magnitude of the vector sums $M_1$ and $M_2$ may differ.

The change in magnetic field direction and strength effects the resistances R1 to R4 of the first to fourth magneto-resistors 12, 14, 16 and 18, respectively, and each vector sum is rotated by a respective angle $\theta_1$ to $\theta_4$ with respect to H.

Figure 5:
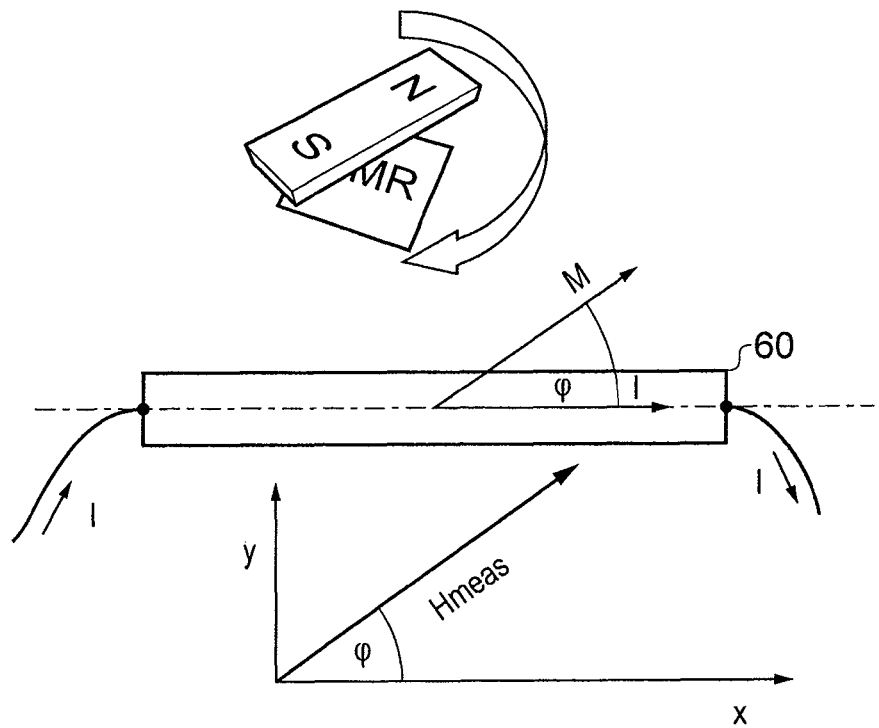
FIG. 5 is a diagram showing a frame of reference for measuring a direction between a magnetic field and a direction of current flow in a magneto-resistor.
Figure 6:
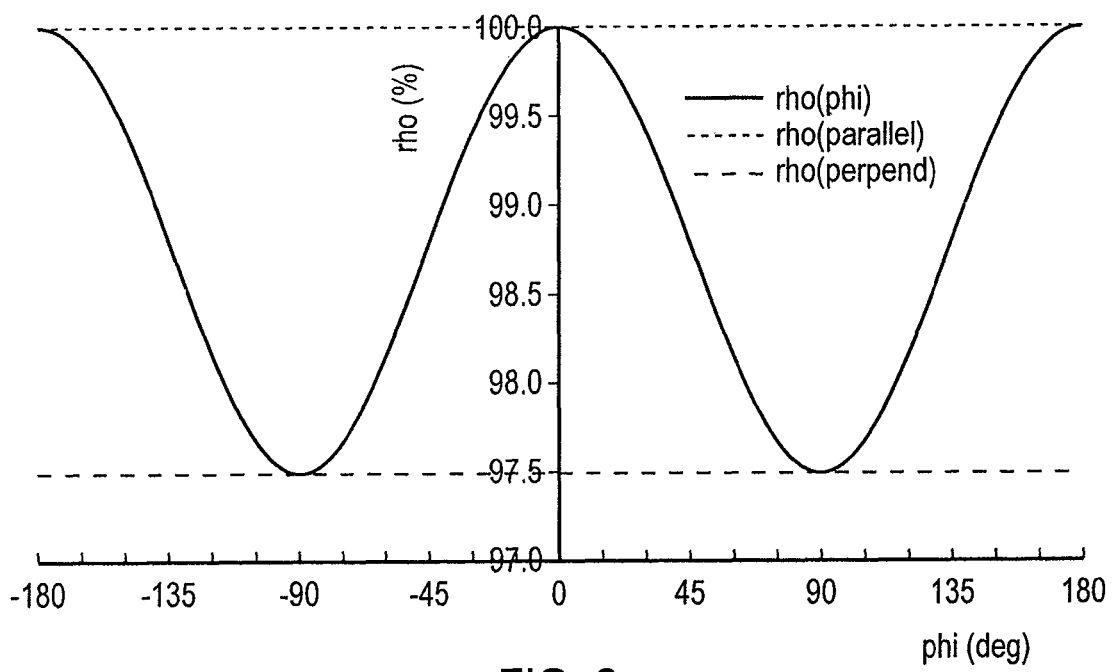
FIG. 6 is a graph showing variations in resistivity as a function of angle of the measured magnetic field to a direction of current flow.

FIG. 5 illustrates a frame of reference defining the angle $\phi$ between the direction of current flow in an elongate and linear magneto-resistor 60 and a magneto-resistor magnetization vector M resulting from a surrounding magnetic field H, and FIG. 6 is a graph showing how bulk resistivity $\rho$ of the magneto-resistor varies with $\phi$. It is known to the person skilled in the art that a sufficiently large magnetic field H causes the magnetization vector M to align with H. This is the mode of operation used in angular field sensors.

The features of note are that $\rho$ (rho) is at a minimum at ±90° and that the response is symmetric about ±90°. This effect can be exploited to increase the effective length of the magneto-resistor and hence increase sensitivity, by allowing a magneto-resistive sensor to be formed from magneto-resistive elements having opposing directions of current flow, as will be discussed later.

From comparing FIGS. 4 and 6, it is apparent that the resistance R1 of the first magneto-resistor 12 will be changed to different extent than that, R2, of the second magneto-resistor 14. In the example illustrated in FIG. 4 $M_2$ is at a higher angle $\rho$ (rho) than $M_1$ and hence R2<R1, assuming R1=R2 in the absence of any magnetic field. Similarly R4<R3. Therefore, for these resistors in a bridge configuration as shown in FIG. 2, $Vout_2$>$Vout_1$ if the magnetic field has a component in the first direction 40, whereas $Vout_2$<$Vout_1$ if the magnetic field has a component in the second direction 42.

The strength of the magneto-resistive response can be enhanced by using resistors that have an increased "length" compared to their "width". This can be achieved by forming a meandering or serpentine pattern in the material forming the magneto-resistors, or by forming each magneto-resistor of several series connected strips or elements of magneto-resistive material. The strips or elements of magneto-resistive material may be deposited parallel to one another.

Figure 7:
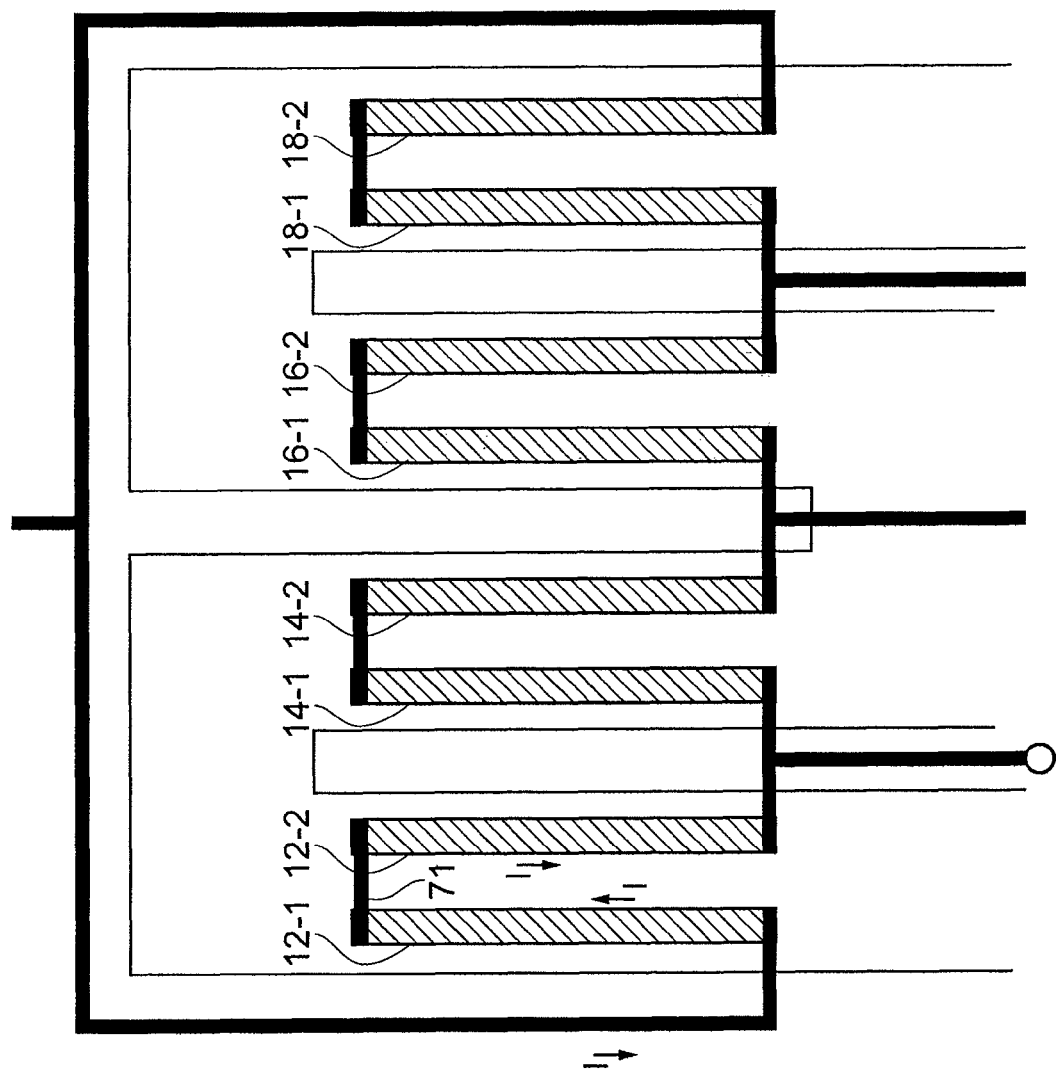
FIG. 7 is a plan view of a further embodiment of a magnetic field direction detector.

FIG. 7 shows in simplified form, a magnetic field direction detector where each magneto-resistor now comprises a plurality of interconnected magneto-resistive elements. Comparing FIG. 7 with FIG. 1, the first magneto-resistor 12 now comprises two magneto-resistive elements 12-1 and 12-2 connected together by way of a metallic link 71 which may be formed over the magneto-resistive material or formed in a layer intermediate the conductor of the perturbation generator 50 and the magneto-resistive elements, or may be part of the magneto-resistive material.

The other magneto-resistors are similarly formed by magneto-resistive elements 14-1, 14-2; 16-1, 16-2; 18-1 and 18-2.

Although the current flow is in opposite directions within the magneto-resistive element 12-2 compared to the current flow in element 12-1, the symmetry in the resistivity characteristic around the 90° direction means that the response of the two elements is identical. Each magneto-resistor 12, 14, 16 and 18 can be made of a plurality of magneto-resistive elements, e.g. two, three, four, five and so on. The resistance, and hence the resistance change, scales with the number of resistive elements.

The resistive elements have been drawn as linear elements, as this is both the simplest configuration and it is believed to be the most likely, but the invention is not so limited. Even when the external magnetic field is expected to be substantially linearly directional over the spatial existent of the direction detector, the magneto-resistors and the magneto-resistive elements forming them may take other geometries such as arcuate or zigzag. This may enhance the packing of the magnetic field direction detector onto a die containing other components.

Two magnetic field direction detectors can be used to form a quadrant detector, as will now be described.

Figure 8:
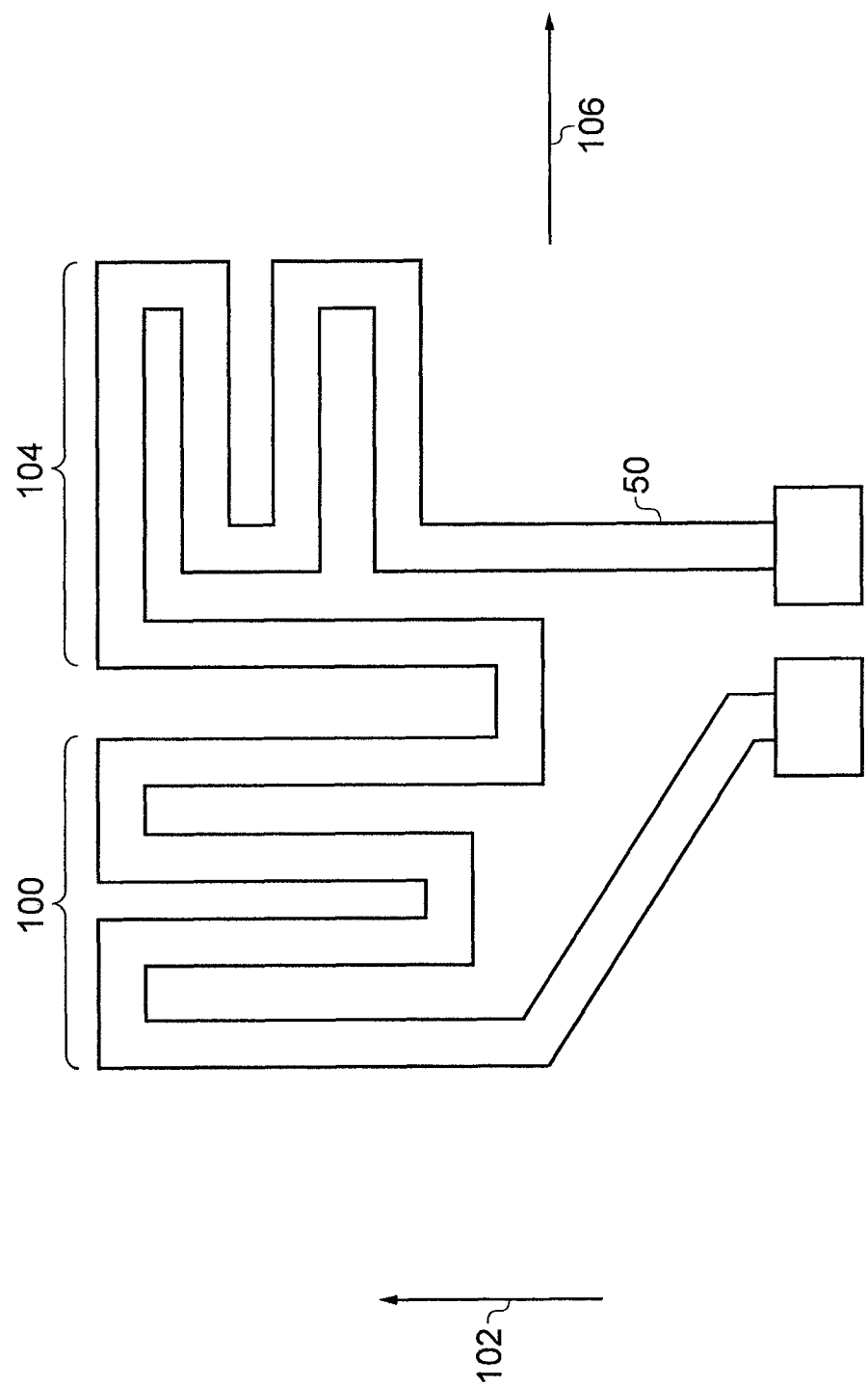
FIG. 8 is a plan view of a conductor acting as a perturbation generator for a quadrant detector constituting an embodiment of the invention.
Figure 9:
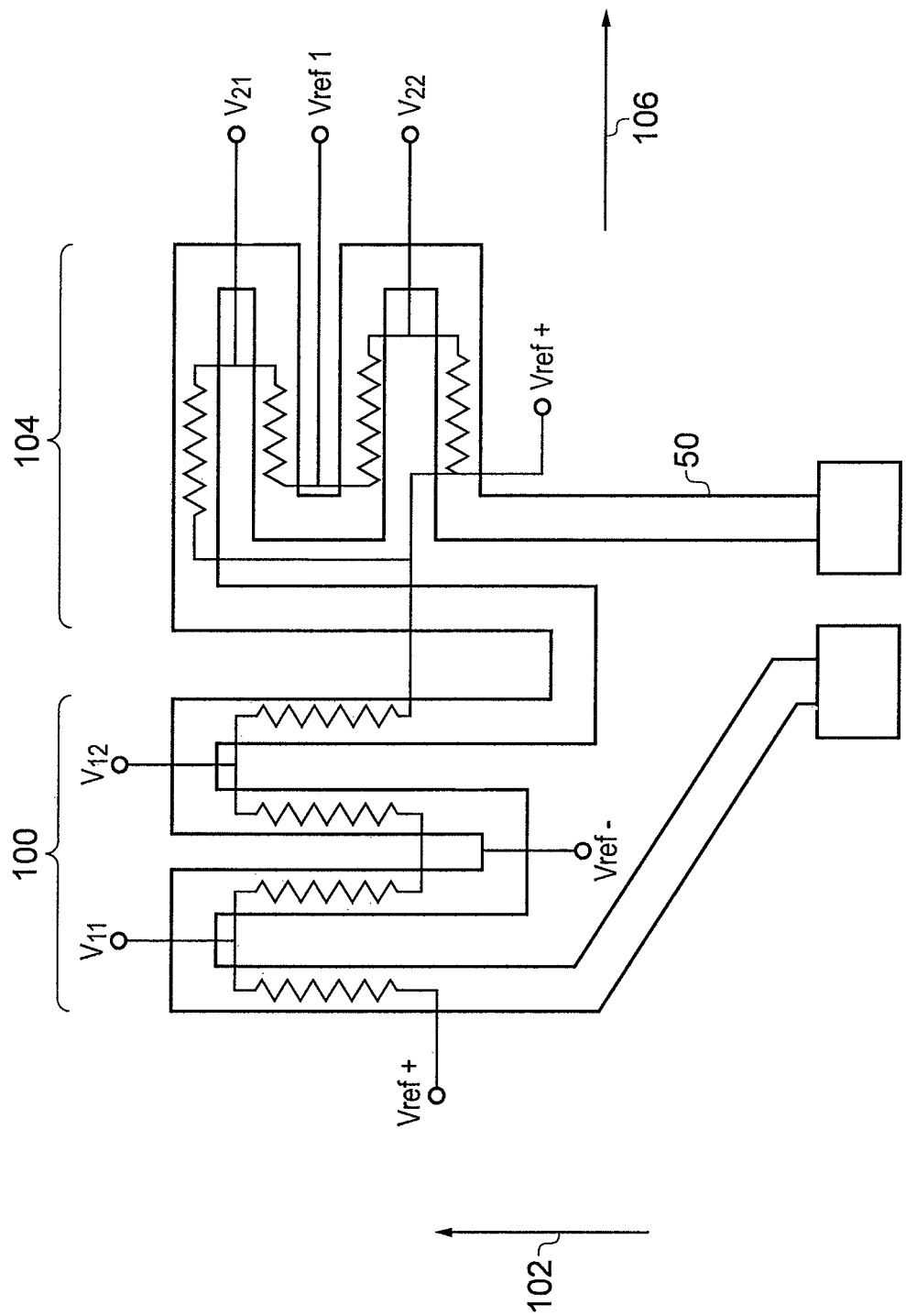
FIG. 9 is a plan view of the perturbation generator of FIG. 8 with the position of magneto-resistors and their interconnections diagrammatically superimposed.

FIG. 8 shows the path of a shared perturbation generator comprising a single conductor 50 for generating the magnetic perturbation in a first direction detector 100 having a detection axis along the direction of arrow 102, and a second direction detector 104 having a detection axis along the direction of arrow 106. Thus the magnitude and direction of the perturbing field can be controlled simultaneously in both magnetic field direction detectors. FIG. 9 is similar to FIG. 8, but also schematically indicates the positions of the first to fourth magneto-resistors in each direction detector 100 and 104 (the magneto-resistors may be made of a plurality of magneto-resistive elements as described with respect to FIG. 7).

A comparator, not shown, may be connected to the first and second outputs of the first direction detector 100 to compare $V_{11}$ with respect to $V_{12}$. Similarly a comparator connected to the outputs of the second bridge 104 may compare $V_{21}$ with respect to $V_{22}$.

Figure 10:
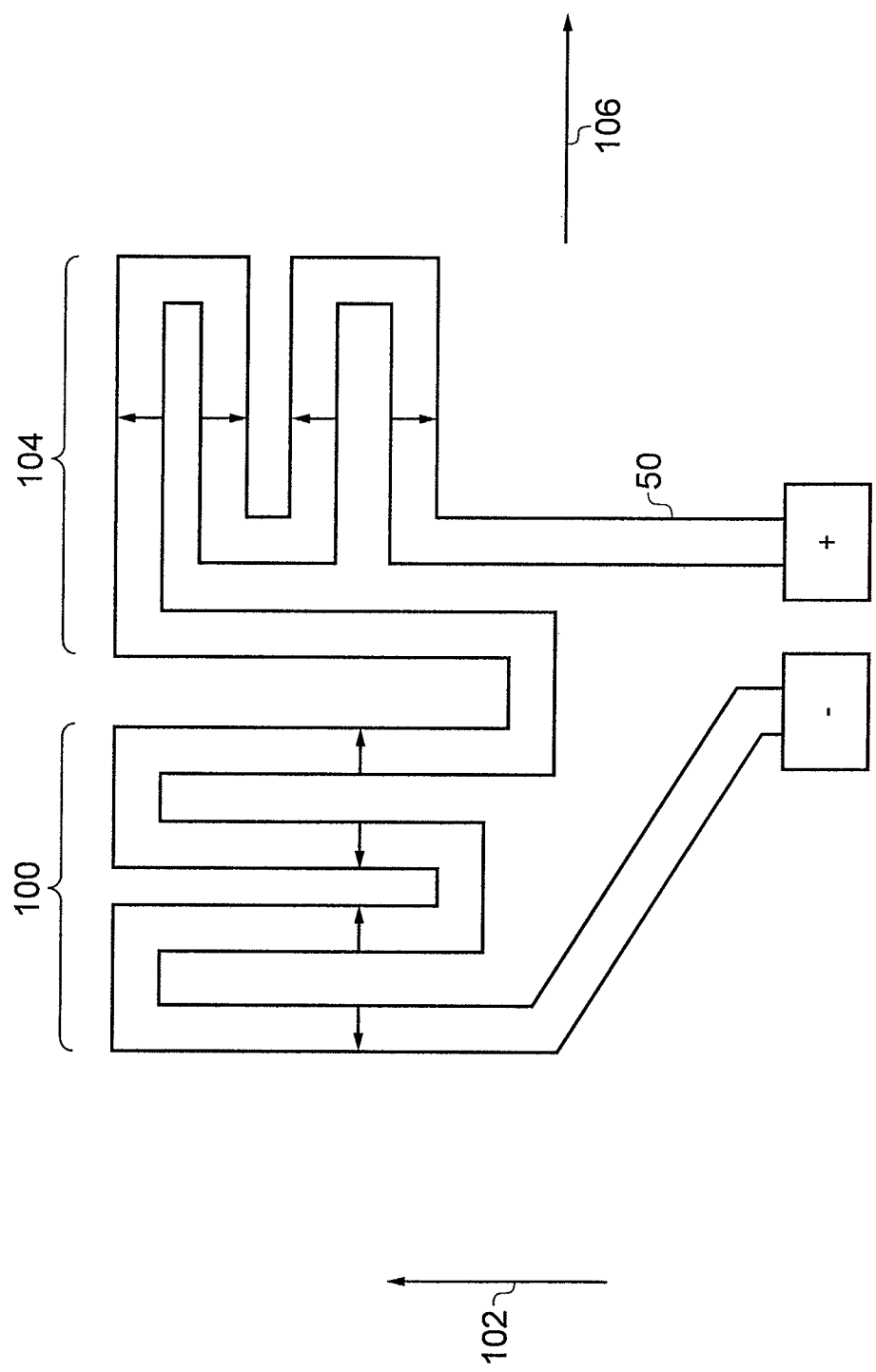
FIG. 10 is a diagram schematically illustrating the directions of perturbing magnetic fields at the magneto-resistors of FIG. 9.

FIG. 10 shows the directions of the perturbing magnetic fields when the conductor of the perturbation generator 50 is energized as shown, and buried beneath the magneto-resistors of FIG. 9.

Figure 11:
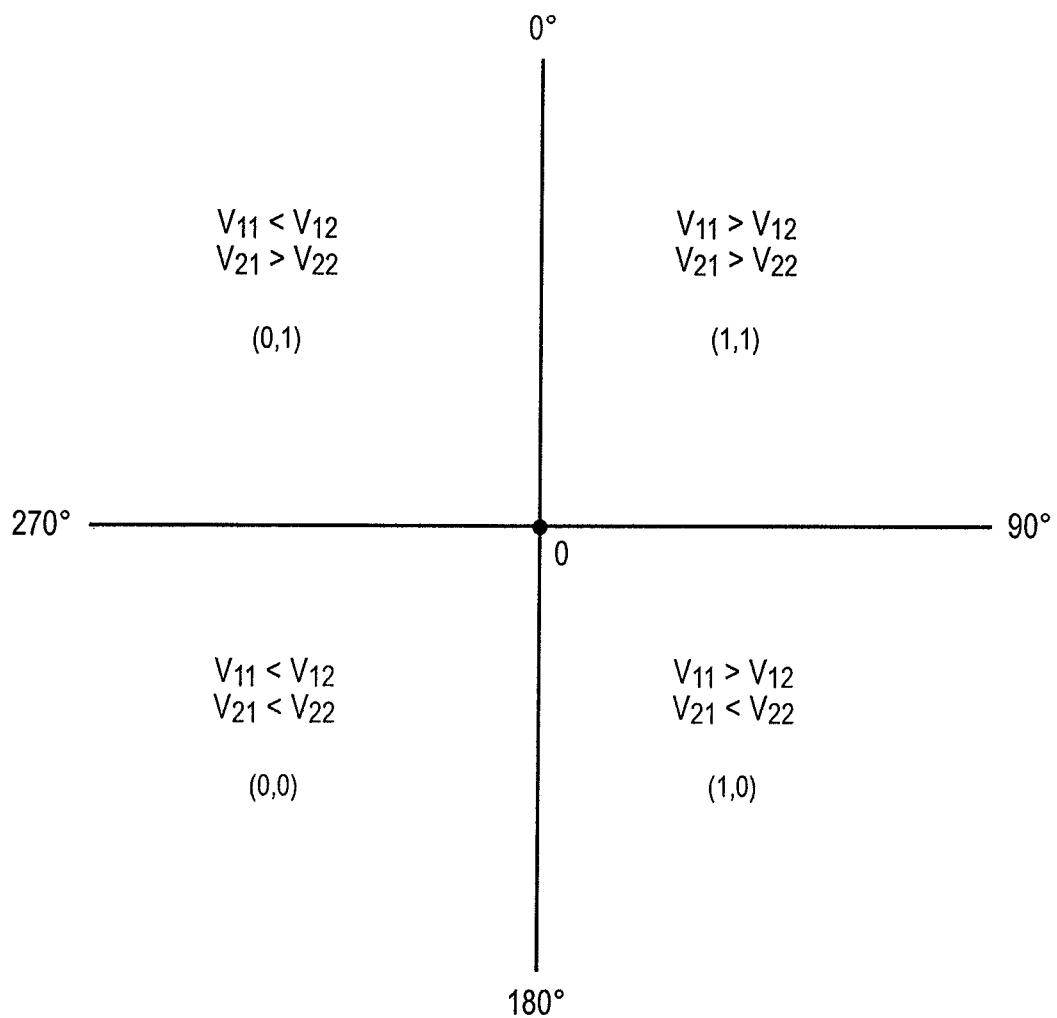
FIG. 11 is a diagram showing, for each quadrant that a magnetic field originates from, the output of the two direction detectors.

It becomes possible to map the relative magnitudes of $V_{11}$ and $V_{12}$, and $V_{21}$ and $V_{22}$ as the magnetic field is travelling left to right or right to left in the x-y plane illustrated in FIG. 11, where the detection axes 102 and 106 are illustrated so as to correspond with the direction shown in FIG. 10.

Thus for a field travelling from left to right the effect of the perturbation is to make $V_{11} > V_{12}$.

The second direction detector checks to see if the field is travelling upwardly or downwardly in the co-ordinate system shown in FIG. 11. If the field is travelling upwardly then $V_{21} > V_{22}$.

If the comparators are arranged such that $V_{11} > V_{12} = 1$, $V_{11} < V_{12} = 0$; $V_{21} > V_{22} = 1$ and $V_{21} < V_{22} = 0$, then the direction of the magnetic field can be represented as a two bit word, as also shown in FIG. 11.

Thus, in this example a magnetic field originating from the origin of travelling in to the 0° to 90° direction is represented by 1,1. In the 90° to 180° direction it is represented by 1,0 and so on. The signs of the comparator outputs can be changed by altering the input connections to $V_{11}$ and $V_{12}$, and to $V_{21}$ and $V_{22}$, and/or by reversing the polarity of the current flowing in the perturbation generator 50 (FIGS. 8, 9 and 10).

It is apparent that two quadrant detectors offset by 45° could be used to determine the direction of a magnetic field to within a sector constituting ⅛ of a circle. With a modification, a detector can also be sensitive to magnetic field directions perpendicular to the plane in which the magneto-resistors are formed. Such an arrangement is schematically illustrated in FIG. 12.

Figure 12:
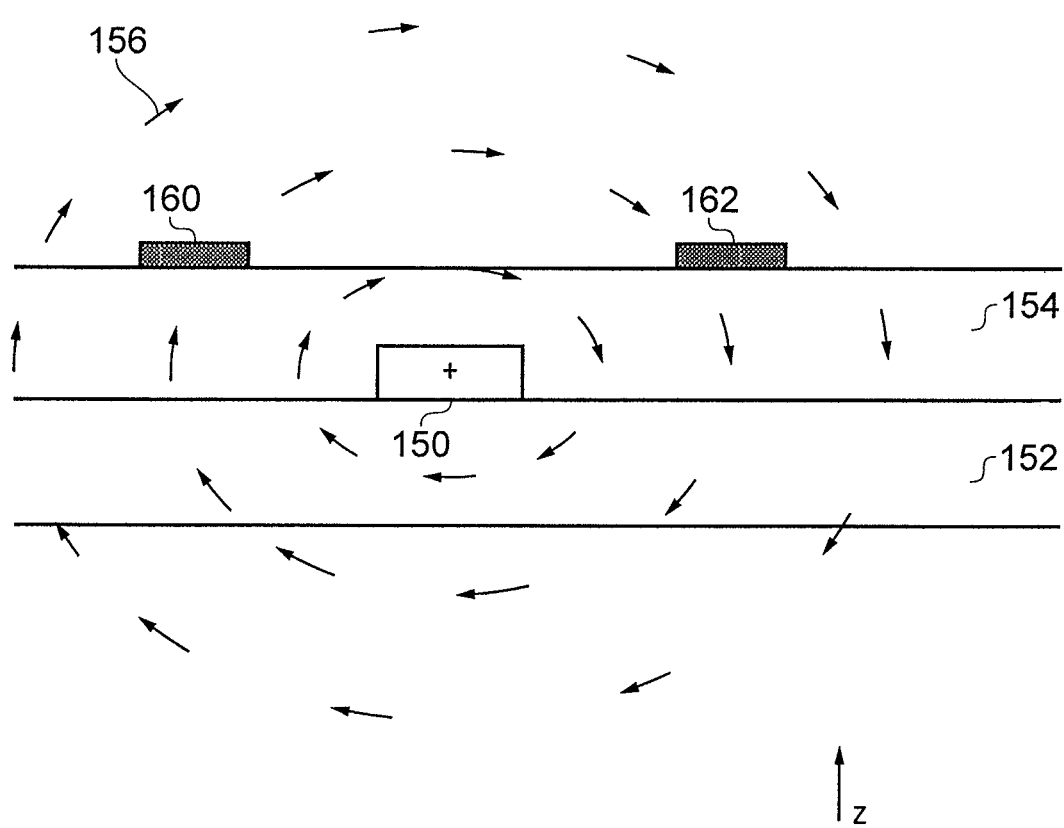
FIG. 12 is a cross section through a further embodiment, and illustrating the relative directions of a perturbing magnetic flux.

As shown in FIG. 12, a conductor 150 is formed over a substrate 152 and embedded within an insulator 154. First and second magneto-resistors 160 and 162 (corresponding to the magneto-resistors 12 and 14 of FIG. 1) are formed over the layer 154, and laterally displaced either side of the conductor 150.

The lines of magnetic flux 156 from current flow in the conductor 150 (conventional current flow direction into the plane of FIG. 12) are illustrated. The perturbing filed has an upward component at magneto-resistor 160 and a downward component at magneto-resistor 162. This allows sensing in the direction perpendicular to the plane of the integrated circuit carrying the magneto-resistors to occur. Such an arrangement may have to compete with shape anisotropy in the magneto-resistor resulting from the material being thin in the Z direction. As a result of this anisotropy, the sensitivity of this embodiment may be limited such that it needs the presence of a strong magnetic field and/or the magneto-resistors need to be formed with additional thickness in the Z direction.

Figure 13:
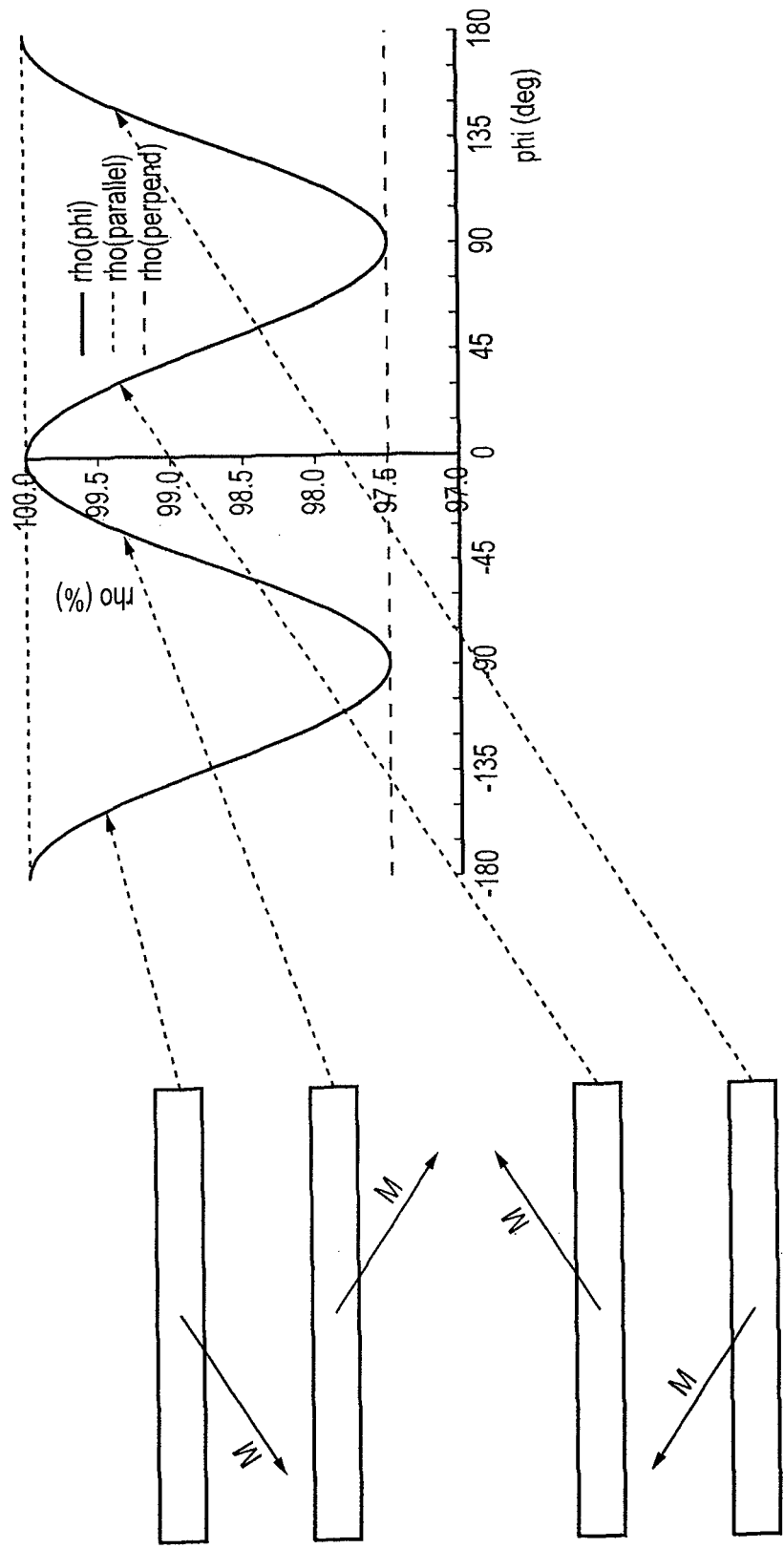
FIG. 13 is a diagram representing directional uncertainty at a magneto-resistive sensor in a magnetic angle direction detector.

The quadrant detector may be used to augment the output from the magnetic angle direction detectors using anisotropic magneto-resistance. Such sensors are also made from strips of magneto-resistive material forming magneto-resistors, but do not have a perturbation generator. In order to understand the limitations of AMR elements as rotation detectors, for example when a bar magnet is carried on a shaft so as to measure the angular rotation of a shaft, consider FIG. 13, which represents the data of FIG. 6, but exemplifies that there are four directions of magnetic field direction M with respect to longitudinal axis of a magneto-resistor that give identical resistivities, and hence identical resistances.

Figure 14:
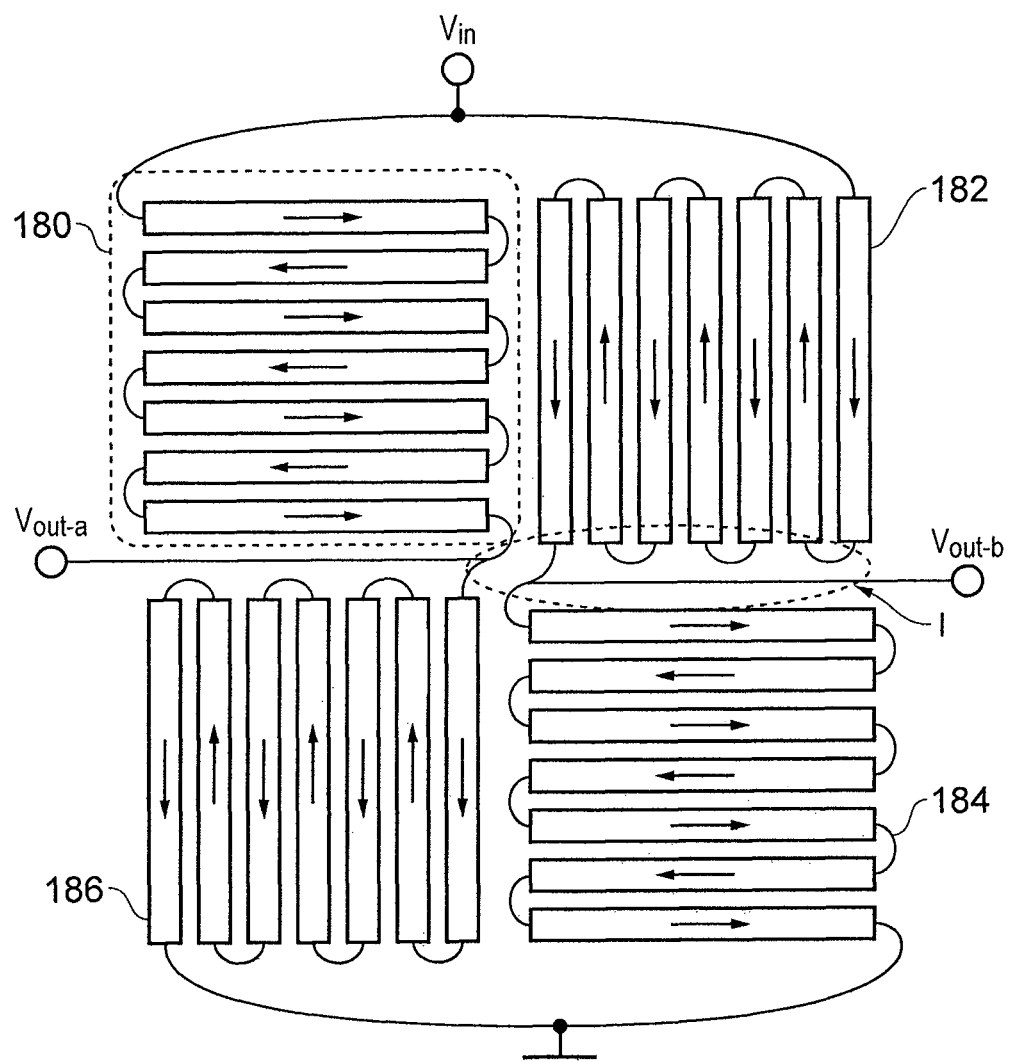
FIG. 14 schematically illustrates an anisotropic magneto-resistive bridge magnetic angle sensor.

This angular ambiguity remains unaltered when the magneto-resistors are placed into a bridge array of the type schematically illustrated in FIG. 14. Here magneto-resistive elements are laid parallel to one another in four blocks to form a bridge of resistors. Thus the seven magneto-resistive elements contained within region 180 form a single magneto-resistor. The regions 182, 184 and 186 form other magneto-resistors which are then placed in a bridge configuration, such that the magneto-resistors 180 and 186 co-operate to form one limb of the bridge, and the magneto-resistors 182 and 184 co-operate to form the other limb of the bridge.

Figure 16:
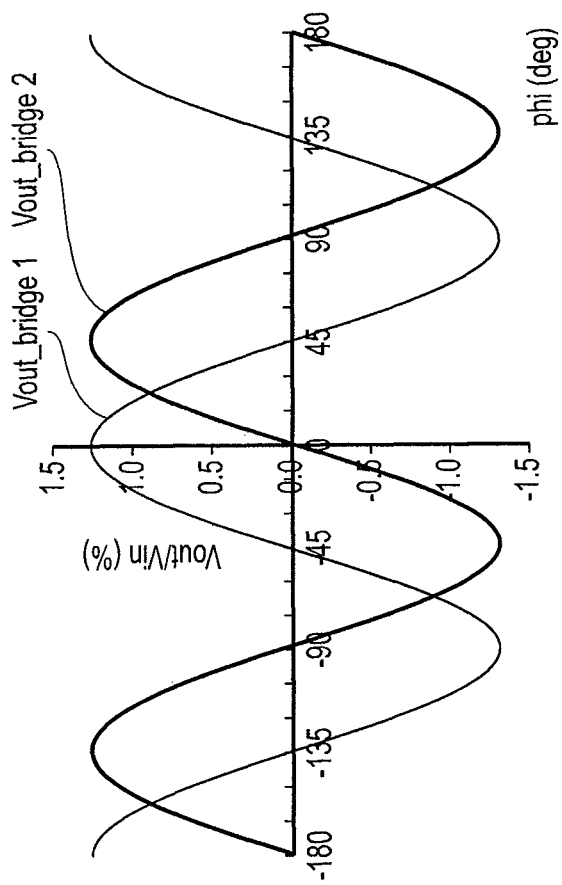
FIG. 16 is a graph representing output voltage versus angle across each bridge of a two bridge magnetic angle position sensor.
Figure 15:
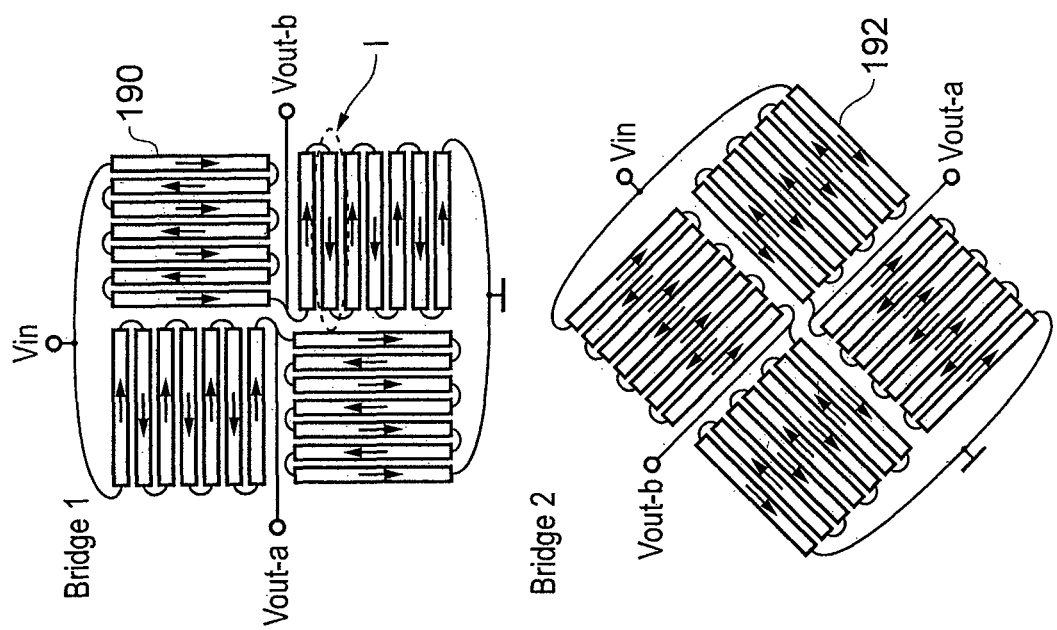
FIG. 15 schematically illustrates a two bridge magnetic angle position sensor.

In known angular position sensors it is known to form two magneto-resistive bridge configurations 190 and 192, with one bridge rotated by 45° with respect to the other bridge, as shown in FIG. 15. For each bridge an output signal Vout=Vout-a−Vout-b can be formed. These responses for the first bridge 190 and the second bridge 192 are illustrated in FIG. 16 as Vout_bridge1 and Vout_bridge2 respectively.

The output from the bridges can be combined as $$\text{Output angle} = 0.5\ \arctan2\left(\frac{\text{Vout\_bridge1}}{\text{Vout\_bridge2}}\right)$$

Figure 17:
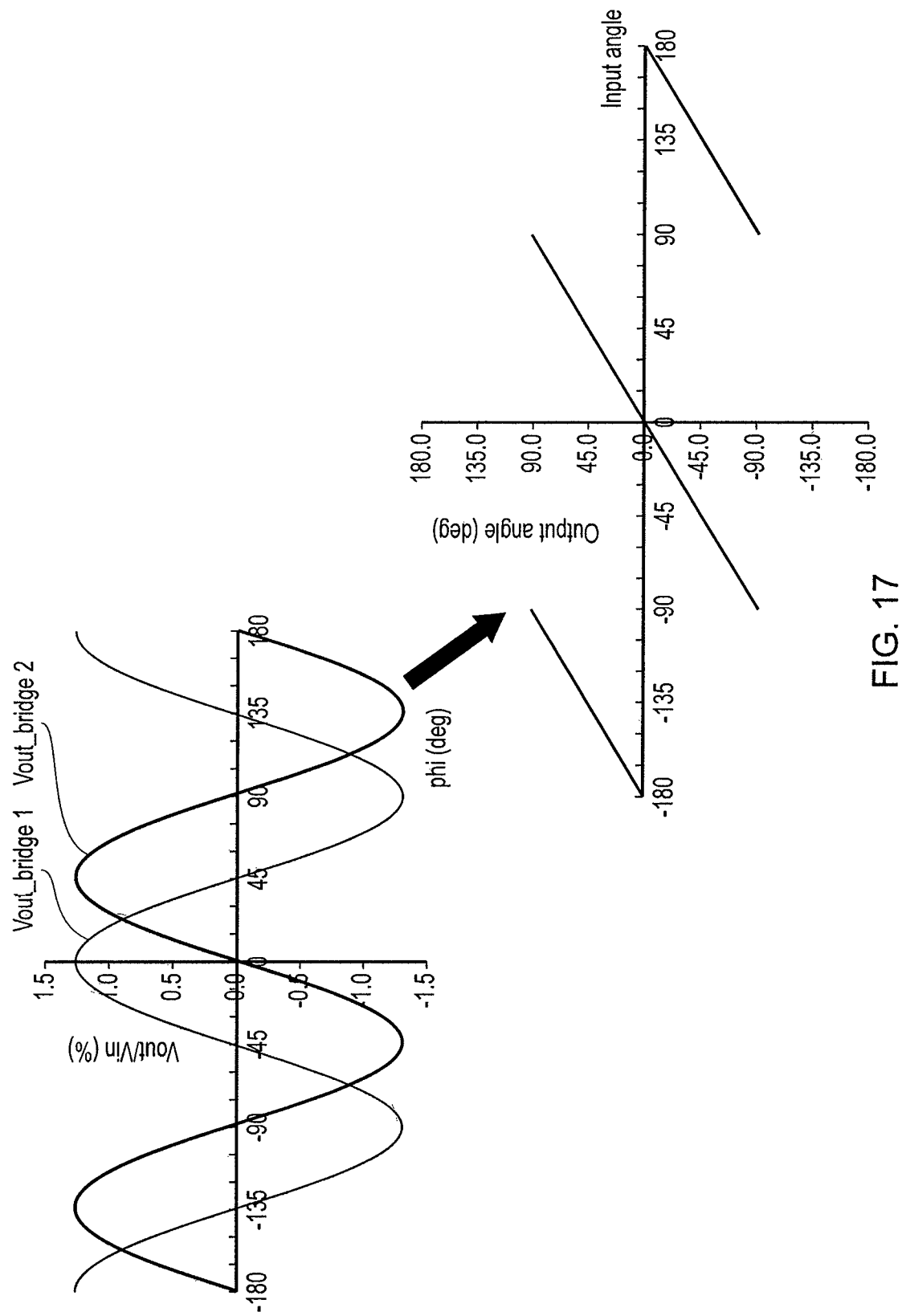
FIG. 17 is a graph showing the monotonic output of a two bridge magnetic angle sensor over a limited angular range after signal processing has taken place.

The output is shown in FIG. 17, and is monotonic in the range −90°<X<90° where X represents the direction of the magnetic field with respect to a sensing axis of the first sensor 190. So ambiguity still exists between, for example, −45° and +135°. However by the inclusion of a quadrant detector as described herein, the angular uncertainty can be resolved and an unambiguous output given.

As noted before, the elements of the quadrant detector, or the individual direction detectors forming it, need not be straight or linear elements. Similarly the individual resistors of a detector need not be placed side by side, but may be disbursed over a substrate to achieve greater packing density. Similarly the conductor used to form the magnetic perturbation need not follow the paths disclosed hereinbefore and might, for example, be formed into a spiral path.

Figure 18:
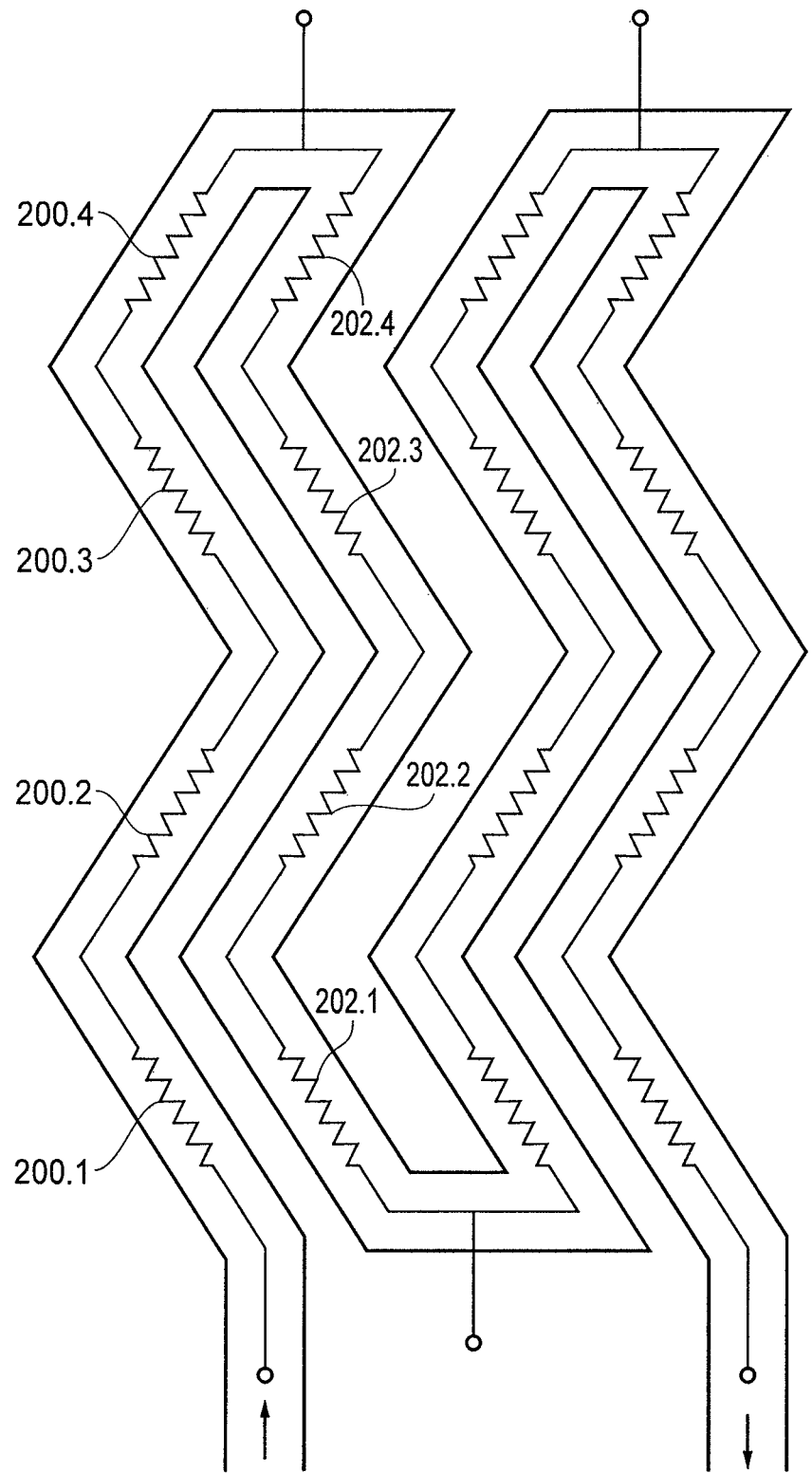
FIG. 18 is a schematic plan view of a further configuration of a perturbation generator.

FIG. 18 shows a modified magnetic field detector where each of the magneto-resistors is formed from a plurality of magneto-resistive elements formed above respective portions of the perturbation generator. This comparing FIG. 18 with FIG. 1, the first resistor 12 of FIG. 1 is now composed of four magneto-resistive elements 200.1 to 200.4. The magneto-resistive elements 200.1 to 200.4 are inclined with respect to one another so as to have a zig-zag pattern above a zig-zag perturbation generator. The other magneto-resistors are similarly formed.

The perturbation conductor need not be permanently energized. An angular position sensor should be able to keep a running estimate of angular position, so it should suffice to power up the quadrant detector, or indeed only a direction detector, at initialization, and/or periodically for checking purposes.

Figure 19:
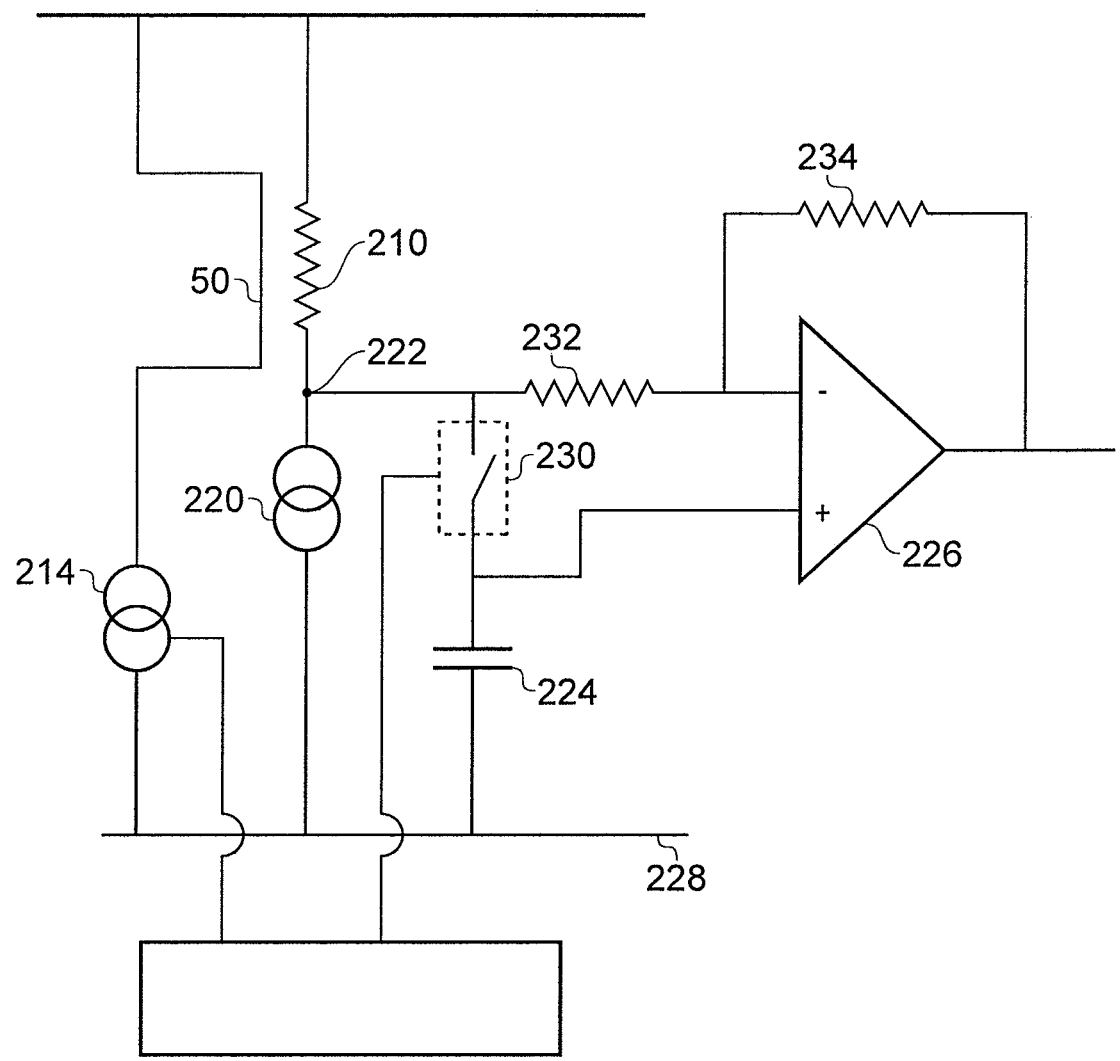
FIG. 19 is a circuit diagram for an embodiment of a magnetic field direction detector using a single magneto-resistor.

FIG. 19 shows a further embodiment where the number of magneto-resistors have been reduced, in this example, to a single resistor 210 placed next to a perturbation generator 50 which can be selectively energized by a controllable current sink 214 (or current source). The current through the magneto-resistor may also be controlled by a current sink 220 as shown, or by a current source. In the presence of a magnetic field having a component transverse to a sensing or detection direction of the resistor 210, energizing the perturbation generator causes the resistance of the resistor 210 to either decrease or increase, depending on the direction of the magnetic field. This causes the voltage at node 222 to change. If this change can be monitored, then the direction of the magnetic field can be estimated. FIG. 19 shows a circuit capable of monitoring the change in voltage at node 222. A capacitor 224 has a first terminal connected to a non-inverting input of an operational amplifier 226. A second terminal of the capacitor is connected to a local ground or to a supply rail 228. An electrically controlled switch 230, for example formed by a FET, is provided to connect the first terminal of the capacitor 224 to node 222. The inverting input of the amplifier 226 is connected to the node 222 by a resistor, and also to the output of the amplifier 226 by resistor 234. These resistors act to define the gain of the amplifier 226.

When switch 230 is closed, the capacitor can charge to the voltage of node 222. During this time the current sink 214 may be de-energized so that no current flows in the perturbation generator 50. When it is desired to check the direction of the magnetic field, the switch 230 is opened such that the voltage at node 222 is held on the capacitor 224. The perturbation generator is then energized, causing the resistance of the resistor 210 to change, and hence the voltage at node 222 to change. This new voltage is provided to the inverting input where it is compared with the immediately preceding value by the amplifier 226, and the sign of the amplifier output is indicative of the direction of the magnetic field. The amplifier 226 may be replaced by a comparator and resistors 232 and 234 dispensed with, and the inverting input of the comparator connected directly to node 222.

The direction detector is suitable for integration within an integrated circuit containing angular position sensors, and in some circumstances the same AMR bridge may be used to form part of an angular direction detector and the direction detector, i.e. semi-sphere or quadrant detector of the present invention.

The claims presented here are in single dependency format suited for presentation at the USPTO. However for other jurisdictions where multiply dependent claims can be presented without a claims fee penalty, it is to be understood that each claim may depend on any preceding claim of a same or similar claim type, except where that is clearly not technically feasible.

What is claimed is:

1. A magnetic field direction detector comprising:
   a first magneto-resistive sensor;
   a second magneto-resistive sensor; and
   a perturbation generator;
   wherein the perturbation generator causes an external magnetic field to be perturbed so as to cause the apparent direction of flux to change by an angle $\theta_1$ at the first magneto-resistive sensor,
   wherein the perturbation generator causes the apparent direction of flux to change by an angle $\theta_2$ at the second magneto-resistive sensor such that the relative resistances of the first and second magneto-resistive sensors vary with respect to one another,
   wherein the magnetic field direction detection is based at least in part on the changes of apparent direction of flux and the relative resistances at the first and second magneto-resistive sensors,
   wherein the magnetic field direction detector is configured to detect whether a magnetic flux has a component of field from a first side or a second side of a detection axis.

2. A magnetic field direction detector as claimed in claim 1, wherein the first magneto-resistive sensor comprises a plurality of magneto-resistive elements inclined with respect to one another, and wherein the second magneto-resistive sensor comprises another plurality of magneto-resistive elements inclined with respect to one another.

3. A magnetic field direction detector as claimed in claim 1, in which the perturbation generator is a conductive element that generates a magnetic field when a current is passed through it.

4. A magnetic field direction detector as claimed in claim 3, in which the current flow in the perturbation generator can be inhibited or reversed.

5. A magnetic field direction detector as claimed in claim 4, in which the conductive element is displaced from the first and second magneto-resistive sensors.

6. A magnetic field direction detector as claimed in claim 3, in which the first and second magneto-resistive sensors are formed in a first plane, and the conductive element is, at least partially, formed in a second plane parallel to the first plane.

7. A magnetic field direction detector as claimed in claim 3, in which the conductive element is formed as a meandering track so as to provide opposed perturbing magnetic fields at the first and second magneto-resistive sensors.

8. A magnetic field direction detector as claimed in claim 1, further comprising an electronic circuit for comparing the resistances of the first and second magneto-resistive sensors in order to determine which direction the magnetic field originates from.

9. A magnetic field direction detector as claimed in claim 1, further comprising third and fourth magneto-resistive sensors, and wherein the perturbation generator causes an apparent direction of flux at the third sensor to change by an angle $\theta_3$, and an apparent direction of flux at the fourth sensor to change by an angle $\theta_4$.

10. A magnetic field direction detector as claimed in claim 9, in which the first and fourth magneto-resistive sensors have the same nominal resistance in the absence of a magnetic field, and the second and third magneto-resistive sensors have the same nominal resistance in the absence of a magnetic field, and the first and second magneto-resistive sensors are connected in series between first and second reference voltage input nodes, and the fourth and third magneto-resistive sensors are connected in series between the first and second reference voltage nodes.

11. A quadrant detector comprising first and second magnetic field direction detectors, each of which being as claimed in claim 1, said first and second magnetic field direction detectors having respective detection axes oriented at approximately 90° with respect to each other.

12. A quadrant detector as claimed in claim 11, in which the perturbation generators of the first and second magnetic field direction detectors are formed by a shared conductor that generates a magnetic field when a current passes through it.

13. A quadrant detector as claimed in claim 11, in which each magnetic field direction detector comprises the first and second magneto-resistive sensors and third and fourth magneto-resistive sensors arranged in a bridge circuit, with the first and second magneto-resistors magneto-resistive sensors being arranged in one limb, and experiencing opposing perturbing fluxes from the perturbation generator.

14. A quadrant detector as claimed in claim 11, in conjunction with an angular direction detector.

15. A method of resolving directional uncertainty about the direction of a magnetic field, the method comprising producing a perturbing magnetic field at a magneto-resistive magnetic sensor such that for first direction of magnetic field the resultant combination makes a first observable change in a parameter of the magnetic field sensor, and for a second direction of magnetic field opposed to the first direction the resultant combination makes a second observable change in a parameter of the magnetic field sensor; and resolving directional uncertainty about the direction of the magnetic field based at least in part on the first observable change and the second observable change.

16. A method as claimed in claim 15, in which when the magnetic field has a component transverse to a direction of current flow in a magneto-resistor or a portion thereof, then for one of the first and second directions the apparent magnetic field at the magneto-resistor becomes more inclined with respect to the direction of current flow or has an increase in magnitude, for the other one of the first and second directions the apparent magnetic field at the magneto-resistor becomes less inclined with respect to the direction of current flow or has a decrease in magnitude.

17. A method as claimed in claim 15, comprising: determining a direction of magnetic field by observing the outputs of a plurality of magneto-resistors formed in a bridge configuration; and providing two bridges at approximately 90° to one another, and processing the outputs of each bridge so as to resolve the direction of a magnetic field into quadrants of a circle.

18. A method as claimed in claim 15, comprising providing two bridges at approximately 90° to one another, and processing the outputs of each bridge so as to resolve the direction of a magnetic field into quadrants of a circle wherein the direction uncertainty is about whether a magnetic flux has a component of field from a first side or a second side of a detection axis of the magnetic field sensor, wherein the magnetic field sensor comprises: a first magneto-resistive sensor; and a second magneto-resistive sensor.

19. A magnetic field direction detector comprising: a first magneto-resistive sensor; a second magneto-resistive sensor; and a perturbation generator; wherein the perturbation generator causes an external magnetic field to be perturbed so as to cause the apparent direction of flux to change by an angle $\theta_1$ at the first magneto-resistive sensor, wherein the perturbation generator causes the apparent direction of flux to change by an angle $\theta_2$ at the second magneto-resistive sensor such that the relative resistances of the first and second magneto-resistive sensors vary with respect to one another, and wherein the magnetic field direction detection is based at least in part on the relative resistances of the first and second magneto-resistive sensors, wherein the magnetic field direction detector is configured to resolve directional uncertainty about the direction of the external magnetic field.

20. A magnetic field direction detector as claimed in claim 19, further comprising third and fourth magneto-resistive sensors, and wherein the perturbation generator causes an apparent direction of flux at the third sensor to change by an angle $\theta_3$, and the apparent direction of flux at the fourth sensor to change by an angle $\theta_4$.

* * * * *